(12) United States Patent
Guitart et al.

(10) Patent No.: US 8,981,748 B2
(45) Date of Patent: Mar. 17, 2015

(54) METHOD OF FORMING A SEMICONDUCTOR POWER SWITCHING DEVICE, STRUCTURE THEREFOR, AND POWER CONVERTER

(75) Inventors: Jaume Roig Guitart, Oudenaarde (BE); Filip Bauwens, Ghent (BE)

(73) Assignee: Semiconductor Components Industries, LLC, Phoenix, AZ (US)

( * ) Notice: Subject to any disclaimer, the term of this patent is extended or adjusted under 35 U.S.C. 154(b) by 770 days.

(21) Appl. No.: 13/205,282

(22) Filed: Aug. 8, 2011

(65) Prior Publication Data

US 2013/0038304 A1 Feb. 14, 2013

(51) Int. Cl.
  *G05F 1/00* (2006.01)
  *H03K 17/06* (2006.01)
  *H03K 17/567* (2006.01)
  *H01L 29/40* (2006.01)
  *H01L 29/78* (2006.01)

(52) U.S. Cl.
  CPC .............. *H03K 17/06* (2013.01); *H03K 17/567* (2013.01); *H01L 29/407* (2013.01); *H01L 29/7803* (2013.01); *H01L 29/7813* (2013.01)
  USPC .......................................... 323/282; 327/427

(58) Field of Classification Search
  USPC ................... 323/222, 282; 327/107, 427, 434
  See application file for complete search history.

(56) References Cited

U.S. PATENT DOCUMENTS

| | | | |
|---|---|---|---|
| 5,945,868 A | 8/1999 | Robb et al. | |
| 7,122,860 B2 | 10/2006 | Peake et al. | |
| 7,195,979 B2 | 3/2007 | Elbanhawy | |
| 7,495,877 B2 | 2/2009 | Havanur | |
| 7,800,176 B2 | 9/2010 | Werner | |
| 7,852,125 B2 * | 12/2010 | Lopez et al. | 327/108 |
| 8,193,570 B2 * | 6/2012 | Sapp et al. | 257/301 |
| 8,735,992 B2 * | 5/2014 | Terrill | 257/379 |
| 2005/0167742 A1 * | 8/2005 | Challa et al. | 257/328 |
| 2007/0138544 A1 | 6/2007 | Hirler et al. | |
| 2008/0017920 A1 | 1/2008 | Sapp et al. | |
| 2008/0116865 A1 | 5/2008 | Rice | |
| 2008/0179670 A1 | 7/2008 | Willmeroth et al. | |
| 2010/0163950 A1 | 7/2010 | Gladish et al. | |
| 2012/0200281 A1 * | 8/2012 | Herbsommer et al. | 323/311 |

* cited by examiner

*Primary Examiner* — Jue Zhang
*Assistant Examiner* — Lakaisha Jackson
(74) *Attorney, Agent, or Firm* — Robert F. Hightower

(57) ABSTRACT

At least one exemplary embodiment is directed to a semiconductor power switching device including a ctrl switch, a sync switch, where a resistor is electrically connected between the ctrl switch and the sync switch.

25 Claims, 6 Drawing Sheets

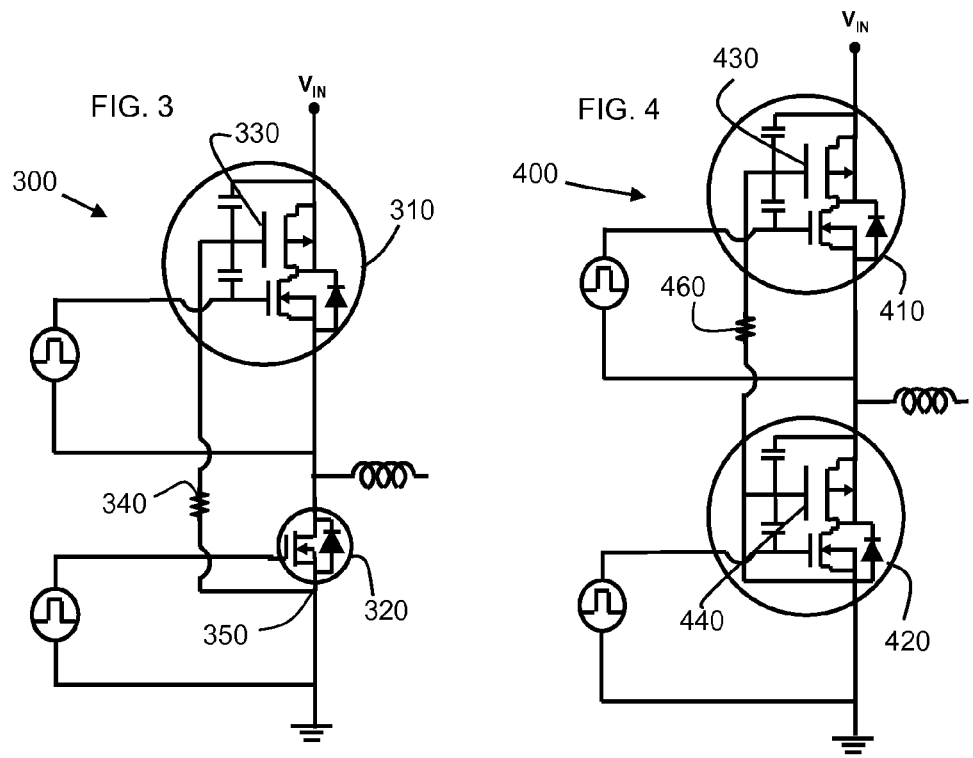
FIG. 3
FIG. 4
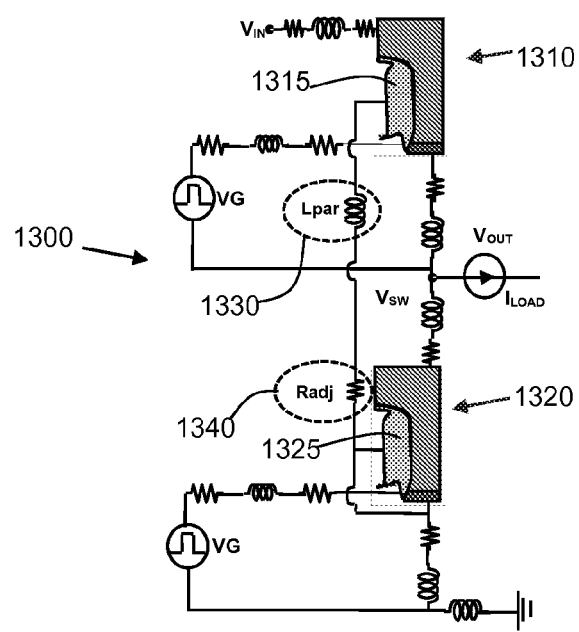
FIG. 5

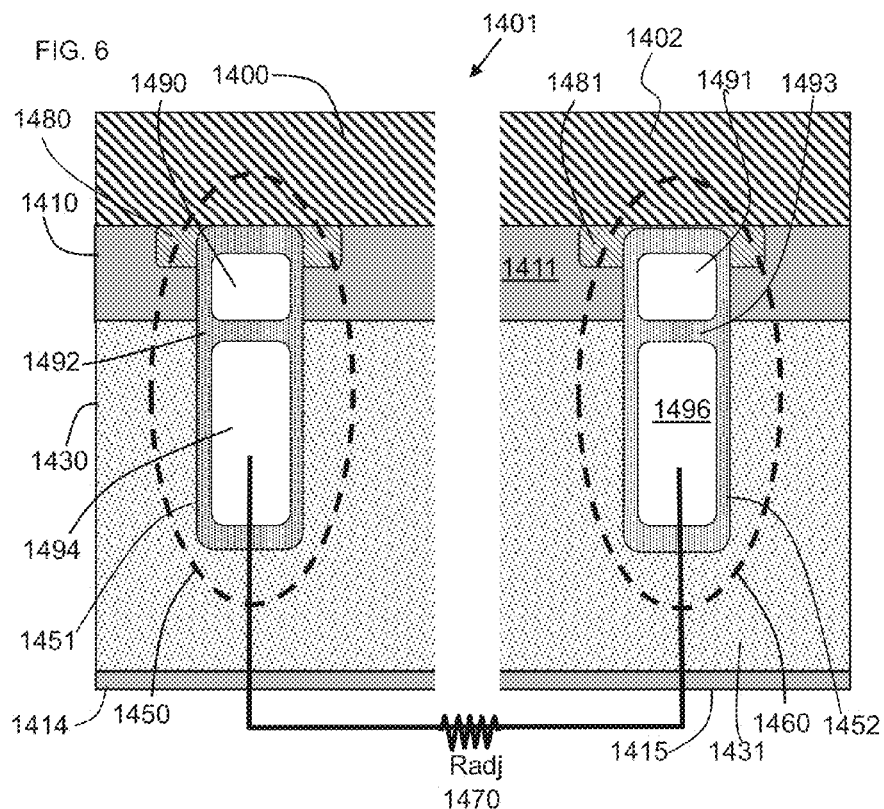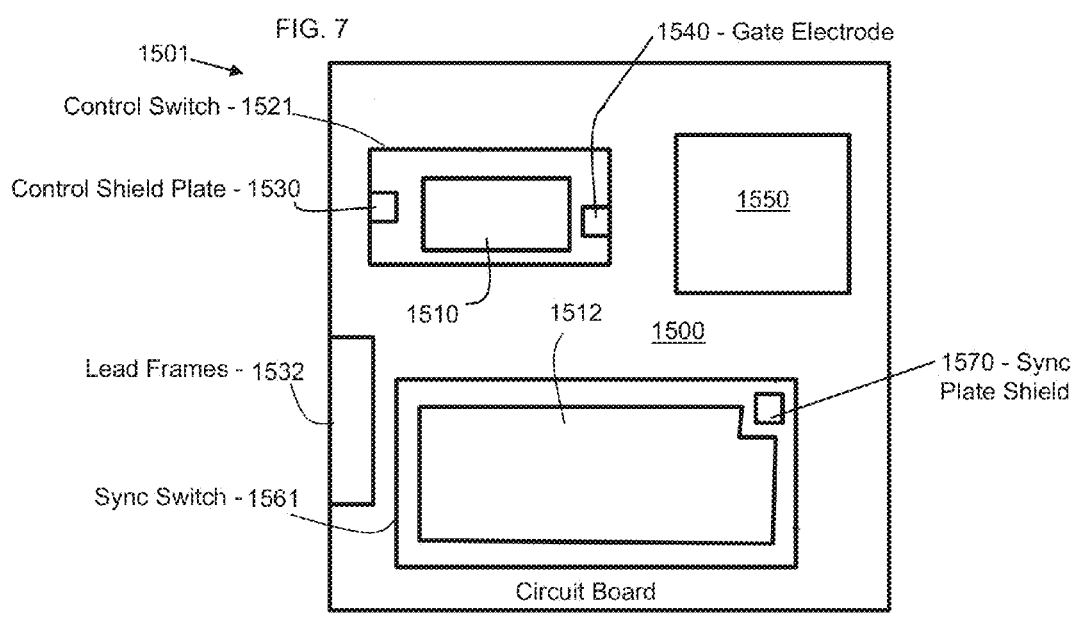

Time (sec)

Time (sec)

Time (sec)

METHOD OF FORMING A SEMICONDUCTOR POWER SWITCHING DEVICE, STRUCTURE THEREFOR, AND POWER CONVERTER

BACKGROUND OF THE INVENTION

The present invention relates in general, to electronics, and more particularly though not exclusively, to switched mode power sources (SMPS), to buck converters, to semiconductors, structures thereof, and methods of forming semiconductor devices.

FIG. 1 illustrates a buck converter 100 that uses a shield gate switch 101 as a control (ctrl) switch with nodes (e.g., 181, 182, 183). The shield gate switch 101, includes a source electrode S/B 130, a plate 155 and associated plate electrode P 150, a gate 165 and associated gate electrode G 160. The drain D 140 is connected to the gate G 160 via several capacitors (C1 and C2). The gate G 160 is connected to plate P 150 via the capacitor C1. The plate P 150 is connected to source S/B 130. The control switch 101 is connected to the output or switching node (Vsw) via node 182. Each node is associated with a signal, with ctrl switch node 181 associated with a control signal 161 Vgctrl, switching node 182 associated with a switching signal 162 Vsw, and synchronization (sync) node 183 associated with a synchronization signal 163 Vgsync.

FIG. 2 illustrates the ringing of the voltages (Vgctrl 161, Vsw 162, and Vgsync 163) that can occur in related art buck converter systems. In DC/DC buck converters with shield-gate switches, when the ctrl switch 101 is turned on, voltage ringing can occur. For example, voltage (Vgctrl 161) ringing at the ctrl switch node 181 can be amplified when connecting the plate electrode 150 to the source 130. The ringing of the voltage (Vsw 162) at the switching node 182 can be transmitted to the driver, thus complicating the circuit control for the buck converter 100, compromising its reliability. Moreover, the voltage capability of the ctrl 101 and sync 102 power switches is overrated to avoid the avalanche phenomenon, facilitating conduction losses in the buck converter 100.

Accordingly, a configuration is needed which damps voltage ringing without reducing the efficiency of the system where the configuration does not impart additional process complexity or extra manufacturing cost.

BRIEF DESCRIPTION OF THE DRAWINGS

Embodiments will become more fully understood from the detailed description and the accompanying drawings, wherein:

FIG. 3 illustrates a voltage control system in accordance with at least one embodiment;

FIG. 4 illustrates a voltage control system in accordance with at least one embodiment;

FIG. 5 illustrates a voltage control system in accordance with at least one embodiment;

FIG. 6 illustrates a semiconductor voltage control system in accordance with at least one embodiment;

FIG. 7 illustrates an integrated voltage control system in accordance with at least one embodiment;

DETAILED DESCRIPTION

Figure 1:
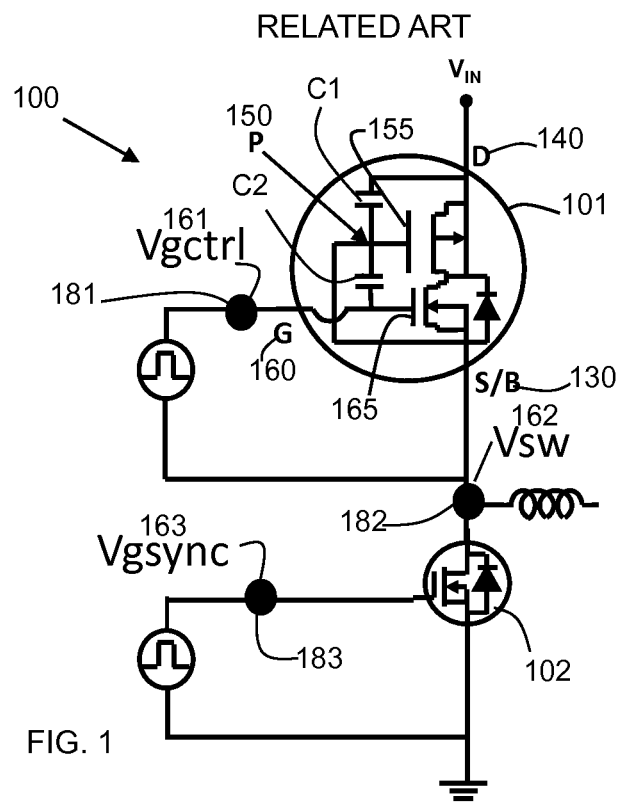
FIG. 1 illustrates a related art buck converter.

The following description of embodiment(s) is merely illustrative in nature and is in no way intended to limit the invention, its application, or uses.

For simplicity and clarity of the illustration(s), elements in the figures are not necessarily to scale, are only schematic and are non-limiting, and the same reference numbers in different figures denote the same elements, unless stated otherwise. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current flow through the device such as a gate of an MOS transistor or a base of a bipolar transistor. Although the devices may be explained herein as certain N-channel or P-channel devices, or certain N-type or P-type doped regions, a person of ordinary skill in the art will appreciate that complementary devices are also possible.

It will be appreciated by those skilled in the art that the words "during", "while", and "when" as used herein relating to circuit operation are not exact terms that mean an action takes place instantly upon an initiating action but that there may be some small but reasonable delay, such as a propagation delay, between the reaction that is initiated by the initial action. Additionally, the term "while" means that a certain action occurs at least within some portion of duration of the initiating action. The use of the word "approximately" or "substantially" means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for semiconductor doping concentrations) are reasonable variances from the ideal goal of exactly as described. When used in reference to a state of a signal, the term "asserted" means an active state of the signal and inactive means an inactive state of the signal.

The terms "first", "second", "third" and the like in the Claims or/and in the Detailed Description are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

In addition, the description illustrates a cellular design (where the body regions are a plurality of cellular regions) instead of a single body design (where the body region is comprised of a single region formed in an elongated pattern, typically in a serpentine pattern). However, it is intended that the description is applicable to both a cellular implementation and a single base implementation.

Processes, techniques, apparatus, and materials as known by one of ordinary skill in the art may not be discussed in detail but are intended to be part of the enabling description where appropriate. For example specific methods of semiconductor doping or etching may not be listed for achieving each of the steps discussed; however one of ordinary skill would be able, without undo experimentation, to establish the steps using the enabling disclosure herein. For example semiconductor structures can be formed by various processes including but not limited to deposition processes, removal processes, patterning processes, and processes that modify the electrical properties. Non-limiting examples of deposition processes include physical vapor deposition (PVD), chemical vapor deposition (CVD), electrochemical deposition (ECD), molecular beam epitaxy (MBE) and atomic layer deposition (ALD). Removal processes include any process that removes material either in bulk or selectively, some non-limiting example of which are etch processes, either wet etching or dry etching and chemical-mechanical planarization (CMP). Patterning includes processes that shape or alter the existing shape of the deposited materials for example lithography. Modification of electrical properties includes doping. Non-limiting examples of doping processes can include rapid thermal annealling (RTA) and modification of dielectric constants in low-k insulating materials via exposure to ultraviolet light in UV processing (UVP).

Embodiments are applicable to various breakdown voltages (BV) for example variations of embodiments can be configured for use with BV from about 5V to about 20 kV. Note also that the doped levels in embodiments can vary. For a non-limiting example N-doped and P-doped regions can have concentrations on the order of about $1 \times 10^{13}$ to about $1 \times 10^{21}$ atoms/cm$^3$. Intrinsic layers are undoped or lightly doped regions (e.g., P-doped) with a dopant concentrations less than about $2 \times 10^{14}$ atoms/cm$^3$. Additionally intrinsic layer thickness can vary for example between about 50 nanometer and about 500 microns.

FIG. 3 illustrates a voltage control system (e.g., semiconductor power switching device) 300 in accordance with at least one embodiment. A ctrl switch 310 is operatively connected to a sync switch 320. As illustrated in FIG. 3, the non-limiting example illustrates a ctrl switch 310, which includes a ctrl shield plate 330 (e.g., split-gate). In the illustrated embodiment the ctrl shield plate 330 can be electrically connected to the source 350 of the sync switch 320. In at least one embodiment the ctrl switch 310 can be a shield gate transistor, and the sync switch 320 can be a transistor. In at least one embodiment a resistor 340 can be electrically connected between the ctrl shield plate 330 of the ctrl switch 310 with the source 350 of the sync switch 320. The resistance of the resistor 340 can vary depending upon the usage for example the resistance can be between about 0.1 mohms and about 100 kohms. In at least one further embodiment the resistance can be between about 80 ohms and about 400 ohms. In yet another embodiment the resistance can be between about 100 ohms and about 1000 ohms. Further in at least one embodiment the shield plate 330 can be a split-gate.

Note that the resistors referred to in embodiments can be various types of resistors, for example the resistor can be at least one of an external resistor, a structure with an intrinsic distributed shield plate resistance, a dedicated shield plate meander resistor, a dedicated or existing resistor (e.g. consisting of poly) inside a trench, poly resistor, a diffused resistor, and a metal resistor and other resistors as known by one of ordinary skill. Note that in at least one embodiment a poly resistor can be used where the resistance varies by the amount of material deposited, for example with the resistance per area of about 15 kohm/0.008 mm$^2$.

FIG. 4 illustrates a voltage control system (e.g., semiconductor power switching device) 400 in accordance with at least one embodiment. A ctrl switch 410 can be operatively connected to a sync switch 420. As illustrated in FIG. 4, the non-limiting example illustrates a ctrl switch 410 which can include a ctrl shield plate 430 (e.g., split-gate), and additionally the sync switch 420. Note that in at least one embodiment ctrl switch 410 and/or sync switch 420 can be MOSFETs. In the illustrated embodiment the ctrl shield plate 430 of the ctrl switch 410 can be electrically connected to the sync shield plate 440 of the sync switch 420. In at least one embodiment a resistor 460 can be electrically connected between the ctrl shield plate 430 of the ctrl switch 410 with the sync shield plate 440 of the sync switch 420. The resistance can vary depending upon usage, for example the resistance can be between about 0.1 mohms and about 100 kohms. In at least one further embodiment the resistance can be between about 80 ohms and about 400 ohms. In yet another embodiment the resistance can be between about 100 ohms and about 1000 ohms. Further in at least one embodiment the ctrl shield plate 430 and/or the sync shield plate 440 are split-gates.

At least one further embodiment is directed to a buck converter comprising: a ctrl switch, where the ctrl switch 410 can be a MOSFET, and where the sync switch can be a MOSFET. Note that in at least one further embodiment the sync switch 420 and/or the ctrl switch 410 can be a transistor and not a MOSFET.

FIG. 5 illustrates a voltage control system 1300 in accordance with at least one embodiment that uses a resistor 1340 and an inductor 1330 connected in series between a ctrl shield plate 1315 of a ctrl switch 1310 (e.g., a control FET) and a sync shield plate 1325 of sync switch 1320 (e.g., a sync FET). In at least one embodiment, an inductor 1330 can be connected in series with the resistor 1340. The inductance of the inductor 1330 can vary between about 0.01 nH and about 500 nH. The inductor 1330 can be an intrinsic (parasitic) part of the voltage control system 1300, or a dedicated extra component.

FIG. 6 illustrates a voltage control system 1401 (e.g., power switching device) fabricated in a semiconductor device including two trench transistors forming a ctrl switch 1450 and a sync switch 1460. The ctrl switch 1450 includes a semiconductor body (e.g., body layer 1410 and drift layer 1430). The sync switch 1460 includes a semiconductor body (e.g., body layer 1411 and drift layer 1431). A ctrl shield plate 1494 of a ctrl switch 1450 can be operatively connected to a sync shield plate 1496 of the sync switch 1460 via a resistor 1470. The ctrl switch 1450 lies between a source electrode 1400 and a drain electrode 1414. The sync switch 1460 additionally lies between a source electrode 1402 and a drain electrode 1415. The source electrodes (e.g., 1400 and 1402) and drain electrodes (e.g., 1414 and 1415) can be formed of conductive material, for example a doped polysilicon and/or metal. For example the plates and electrodes can be formed of polysilicon doped with concentrations between about $10^{18}/cm^3$ to about $10^{21}/cm^3$, where the doping material can vary, for example Boron or Phosphorus. The ctrl switch 1450 and sync switch 1460 can be formed in trenches 1451 and 152 respectively. For example a gate region 1490 can be separated from a ctrl shield plate 1494 by a buffer region 1492 (e.g., dielectric layer, oxide layer, insulator layer, gas region, an intrinsic layer and/or a combination of such layers and regions). Likewise a gate region 1491 for the sync switch 1460 can be separated from a sync shield plate 1496 by a buffer region 1493. The buffer region can have a thickness of about 10 nanometers to 5 microns, and more particularly between about 50 nanometers and 1 micron. The ctrl shield plate 1494 and the sync shield plate 1496 can be formed of a doped polysilicon, for example a polysilicon doped with concentrations between about $10^{15}/cm^3$ to about $10^{18}/cm^3$, where the doping material can vary, for example Boron or Phosphorus. The body layer 1410 of the ctrl switch 1450 can be short circuited to the source zone 1480 by the source electrode 1400. Likewise the body layer 1411 of the sync switch 1460 can be short circuited to the source zone 1481 by the source electrode 1402. Note in at least one embodiment the gate regions 1490 and 1491 can be contacted separately to other layers, and also the ctrl shield plate 1494 and the sync shield plate 1496 can be contacted separately to other layers.

FIG. 7 illustrates an integrated voltage control system 1501 in accordance with at least one embodiment. A circuit board 1500 solution is illustrated in FIG. 7. A ctrl switch 1521 can be electrically connected (e.g. through the board metal layout or other techniques) to a sync switch 1561. The ctrl switch 1521 has a ctrl shield plate 1530 which can be electrically connected to lead frames 1532 on the circuit board 1500. The ctrl switch 1521 includes a gate electrode 1540 which can be electrically connected into a driver IC 1550. The driver IC 1550 can be operatively connected to a sync shield plate 1570 of the sync switch 1561. A ctrl source electrode 1510 on the ctrl switch 1521 can be electrically connected to a sync source electrode 1512 on the sync switch 1561. The ctrl switch 1521 can have separated bondpads for plate, gate, source and drain. Embodiments can include a resistor between the ctrl switch 1521 and sync switch 1561, for example the resistor can use poly stripes.

Figure 2:
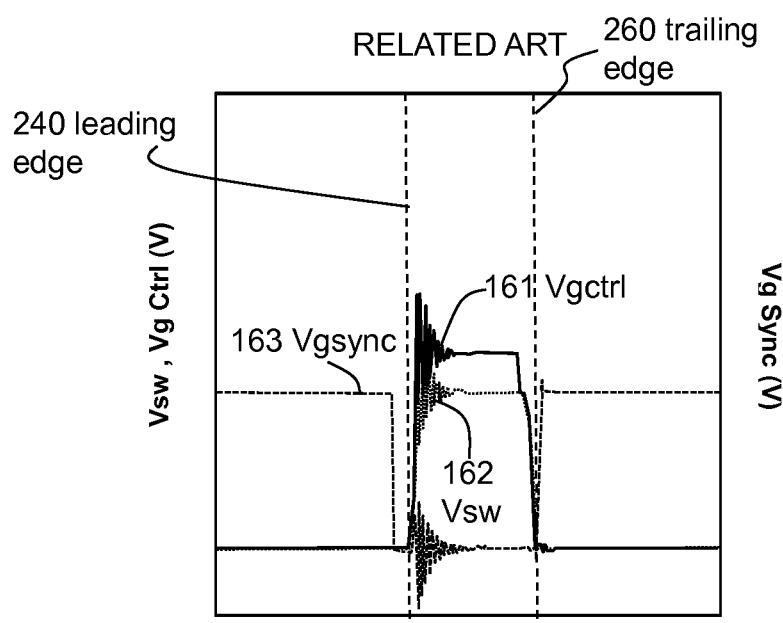
FIG. 2 illustrates the ringing voltages that can occur in related art buck converter systems.

FIG. 2 illustrated Vsw, Vgsync and Vgctrl values of a related art voltage control system. The oscillation peaks illustrate the ringing waveforms of related art systems. For example, in a 48V input voltage buck converter, the voltage peaks in a related art system (e.g., voltages associated with the sync switch 102, FIG. 1) can be above 100V. In related art systems, the voltage peaks during ringing, impact the design of a power MOSFET drift region in order to sustain such voltage peaks and the subsequent increases the resistance Ron.

Figure 8:
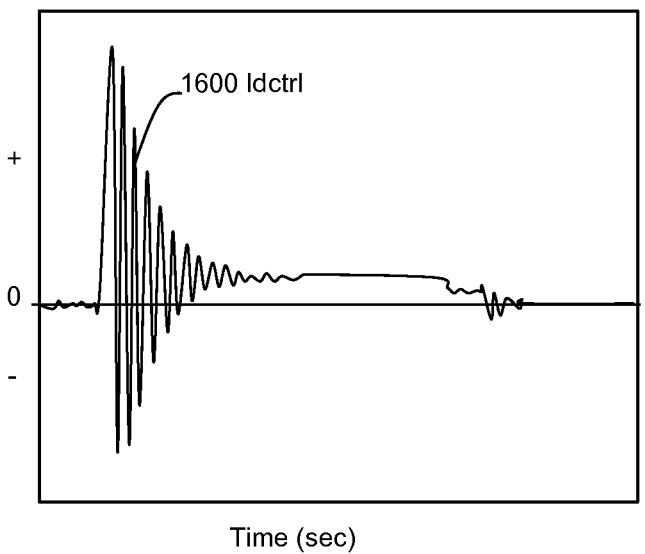
FIG. 8 illustrates a ringing drain current on a control side output of a related art system.
Figure 9:
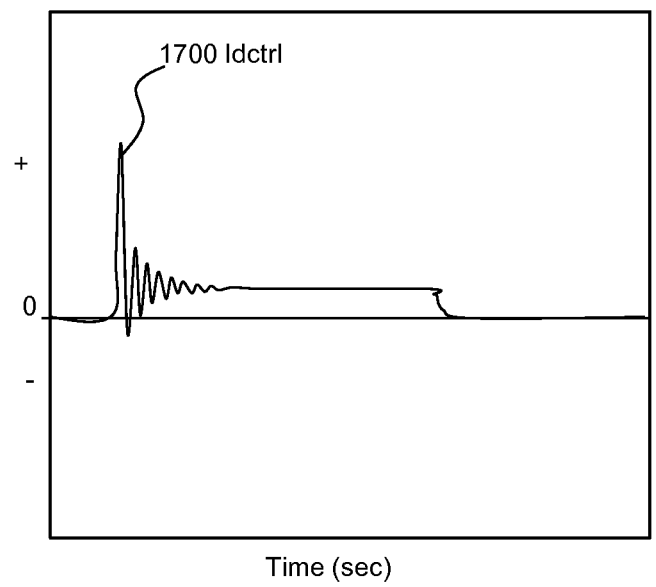
FIG. 9 illustrates a drain current on a control side output of a voltage control system in accordance with at least one embodiment.

At least one embodiment can be implemented so that the voltage peaks are reduced at least to about 50V. Note that 50V is a non-limiting example and that actual voltage reduction is dependent upon the system embodiments are used in. For example FIG. 8 illustrates a ringing drain current Idctrl 1600 on a control side output of a related art system. A non-limiting example of drain current Idctrl 1700 resulting from an embodiment using a similar configuration as used to generate FIG. 9, however with a resistor and inductor connecting a ctrl shield plate of the ctrl switch and the sync shield plate of the sync switch (e.g., 1340 Radj=260 Ohm and 1330 Lpar=0.5 nH) is illustrated in FIG. 9. Note a significant reduction in the peak amplitude between drain current 1600 and drain current 1700. Thus in accordance with an embodiment a voltage control systems can be designed for lower peak ringing voltages. Additionally the reduced current ringing reduces unwanted EM waves, which are created by variations in the currents, where the EM waves can induce unwanted currents in neighboring devices. Thus embodiments can improve EM coupling issues.

Figure 10:
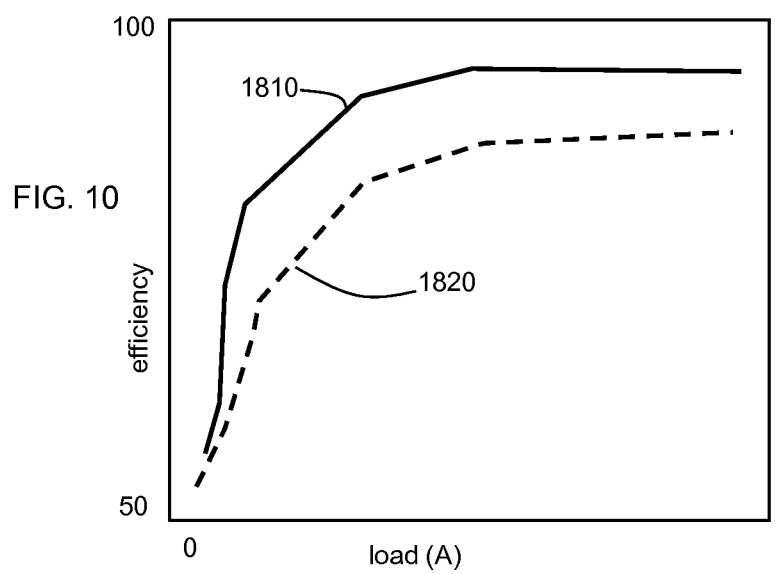
FIG. 10 illustrates comparison of efficiencies for different current loads between related art and a system in accordance with at least one embodiment.

FIG. 10 illustrates comparison of efficiencies for different current loads between related art and a system in accordance with at least one embodiment. The efficiency 1810 of a device in accordance with an embodiment can be greater than the efficiency 1820 for a related art system for various loads. Note that if the efficiency degrades at higher loads the degradation can be alleviated by considering that at least one embodiment facilitates the use of a device with a lower BV (e.g., 60V instead of 110V), and hence a lower on-resistance. In at least one embodiment an inductor can be electrically connected between a ctrl shield plate of a ctrl switch to the sync shield plate of a sync switch. Various values of inductance can be used, for example a value of L ranging from about 0.1 to 100 nH has no significant impact on the waveforms and the efficiency. In at least one embodiment a resistor can be electrically connected between the ctrl shield plate of a ctrl switch to the sync shield plate of a sync switch. Various values of resistance can be used and can have various effects on efficiency, for example a value of R below 100 Ohm reduces the efficiency even though the ringing is reduced.

Figure 11:
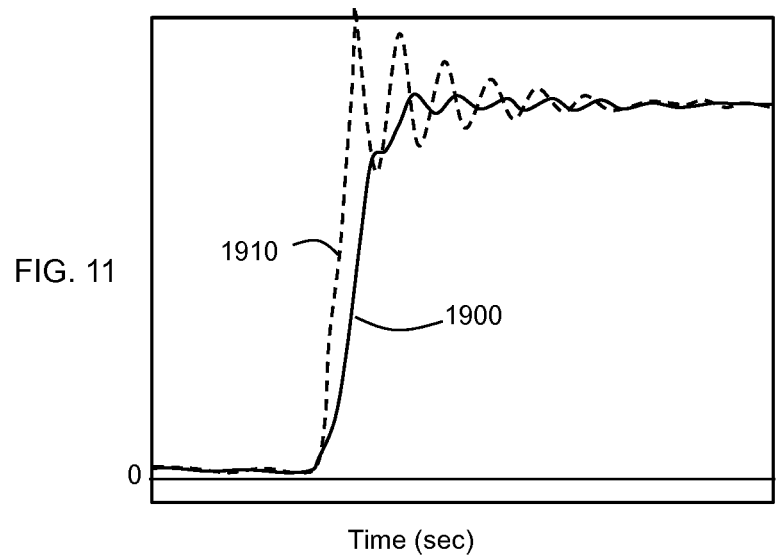
FIG. 11 illustrates a comparison of a Vsw value at a leading edge between a related art voltage control system and a voltage control system in accordance with at least one embodiment.

FIG. 11 illustrates a comparison of a switching signal 1910 at a leading edge of a related art voltage control system and the switching signal 1900 at a leading edge of a voltage control system in accordance with at least one embodiment. As can be seen the switching signal 1900 using at least one embodiment has significantly less ringing (peak to peak variation) than the switching signal 1910 of a related art system.

Figure 12:
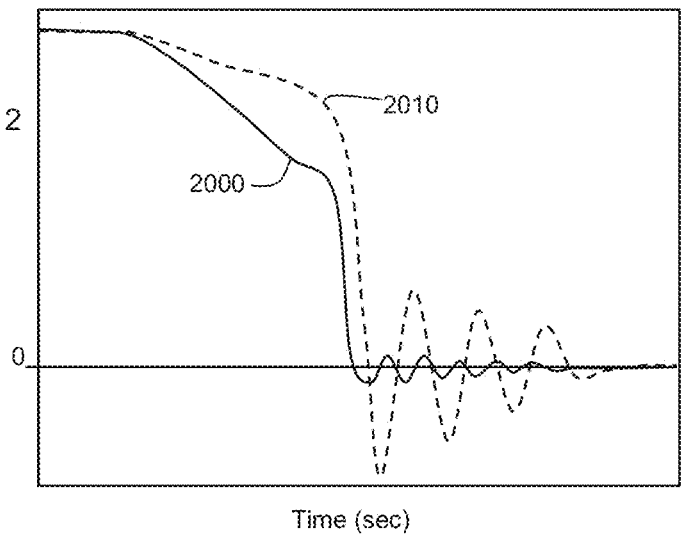
FIG. 12 illustrates a comparison of a Vsw value at a trailing edge between a related art voltage control system and a voltage control system in accordance with at least one embodiment.

FIG. 12 illustrates a comparison of a switching signal 2010 at a trailing edge of a related art voltage control system and a switching signal 2000 at a trailing edge of a voltage control system in accordance with at least one embodiment. As can be seen the switching signal 2000 using at least one embodiment has significantly less ringing (peak to peak variation) than the switching signal 2010 of a related art system.

Figure 13:
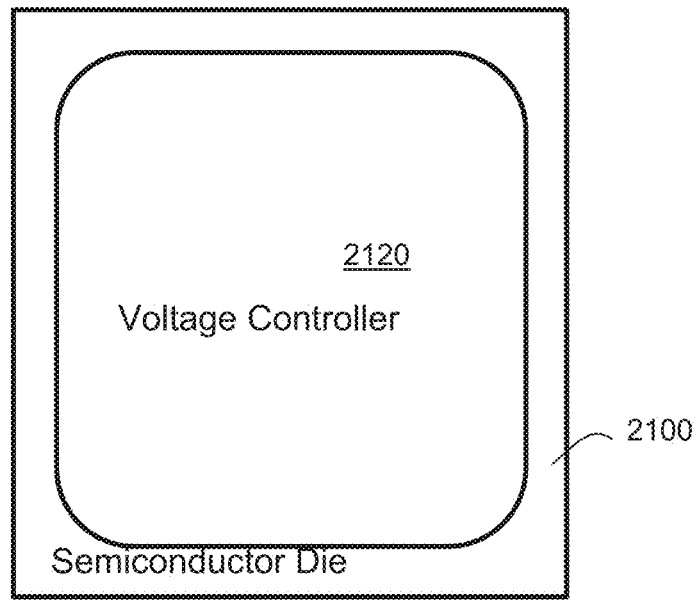
FIG. 13 illustrates an enlarged plan view of a portion of at least one embodiment of a semiconductor device that is formed on a semiconductor die in accordance with at least one embodiment.

FIG. 13 illustrates an enlarged plan view of a portion of at least one embodiment of a voltage controller 2120 that can be formed on a semiconductor die 2100 in accordance with at least one embodiment. Die 2100 can also include other circuits that are not shown in FIG. 13. Voltage controller 2120 can be formed on die 2100 by semiconductor manufacturing techniques that are well known to those skilled in the art.

Thus at least one embodiment can (a) damp the output ringing, (b) improve efficiency for particular current loads, (c) simplify circuit topology, and (d) present a solution that does not require a capacitive element. Note that embodiments can be used for various power systems and devices, for example in DC/DC buck converters with split-gate power MOSFET. The problem of the large output voltage ringing also appears when using split-gate power MOSFET. The switching signal (Vsw) ringing can be reduced using embodiments, while the efficiency can be maintained by designing the -gate power MOSFET for use with BV (e.g., designed for 25V instead of 33V).

While the present invention has been described with reference to embodiments, it is to be understood that the invention is not limited to the disclosed embodiments. The scope of the following claims is to be accorded the broadest interpretation so as to encompass all modifications, equivalent structures and functions. Additionally although specific numbers may be quoted in the claims, it is intended that a number close to the one stated is also within the intended scope, i.e. any stated number (e.g., 90 Volts) should be interpreted to be "about" the value of the stated number (e.g., about 90 Volts).

While the subject matter of the invention is described with specific example embodiments, the foregoing drawings and descriptions thereof depict only typical embodiments of the subject matter and are not therefore to be considered to be limiting of its scope, it is evident that many alternatives and variations will be apparent to those skilled in the art. For example embodiments can be applied to various voltage devices with break down voltages (BV) from about 5V to about 20 kV. For example, the subject matter has been described for use in buck converters; however the present invention can be used in any device for controlling voltage.

Thus, the description of the invention is merely in nature and, thus, variations that do not depart from the gist of the invention are intended to be within the scope of the embodiments. Such variations are not to be regarded as a departure from the spirit and scope.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

What is claimed is:

1. A semiconductor power switching device comprising:
   a ctrl switch, where the ctrl switch is a shield gate transistor;
   a sync switch, where the sync switch is a transistor;
   an inductor; and
   a resistor coupled in series with the inductor, where the series coupled inductor and resistor couple a first plate on the ctrl switch with a source of the sync switch.

2. The switching device according to claim 1, where the sync switch is a second shield gate transistor.

3. The switching device according to claim 2, where the resistor is at least one of an external resistor, an intrinsic distributed shield plate resistance, an existing shield plate meander resistor, a trench resistor, poly resistor, or a metal resistor.

4. The switching device according to claim 3, where the resistor is greater than 100 ohms.

5. The switching device according to claim 4, where the resistor has a value between about 100 ohms and about 1000 ohms.

6. The switching device according to claim 5, where the first plate on the ctrl switch is a ctrl shield plate.

7. The switching device according to claim 6, where the ctrl switch is a MOSFET.

8. The switching device according to claim 6, where the first plate on the ctrl switch is coupled to a second plate on the sync switch.

9. The switching device according to claim 8 where the second plate is a sync shield plate in the sync switch.

10. The switching device according to claim 9, where the sync switch is a MOSFET.

11. The switching device according to claim 1, where the resistor is at least one of an external resistor, an intrinsic distributed shield plate resistance, an existing shield plate meander resistor, a trench resistor, poly resistor, a diffused resistor, or a metal resistor.

12. The switching device according to claim 11, where the resistor is greater than 100 ohms.

13. The switching device according to claim 12 where the resistor has a value between about 100 ohms and about 1000 ohms.

14. The switching device according to claim 13, where the first plate on the ctrl switch is a ctrl shield plate.

15. The switching device according to claim 14, where the ctrl switch is a MOSFET.

16. The switching device according to claim 14, where the first plate on the ctrl switch is coupled to a second plate on the sync switch.

17. The switching device according to claim 16 where the second plate is a sync shield plate in the sync switch.

18. The switching device according to claim 17, where the sync switch is a MOSFET.

19. The switching device according to claim 1, where the inductor has a value between about 0.01 nH and about 500 nH.

20. A method of forming a power switching device comprising:
    configuring a voltage control device with a ctrl switch and a sync switch including a source, where the ctrl switch has a ctrl shield plate; and
    coupling a resistor between the ctrl shield plate and a source of the sync switch wherein the switching device is devoid of a second resistor coupling the ctrl shield plate to a drain of the ctrl switch.

21. The method according to claim 20 where the ctrl switch is a shield gate transistor.

22. The method according to claim 20, further comprising: coupling a ctrl shield plate of the ctrl switch to the source.

23. The method according to claim 22, where the sync switch is a shield gate transistor.

24. The method according to claim 23, where the sync switch has a sync shield plate, where ctrl shield plate is coupled to the sync shield plate.

25. A power converter comprising:
    a ctrl switch, where the ctrl switch is a MOSFET, where the ctrl switch includes a ctrl shield plate;
    a sync switch, where the sync switch is a MOSFET, where the sync switch includes a sync shield plate; and
    a resistor, where the resistor is coupled between the ctrl shield plate and the sync shield plate, where the ctrl shield plate is coupled to a sync switch source, and where the resistor has a value between about 0.1 mohms and about 100 kohms wherein the ctrl switch is devoid of a second resistor coupling the ctrl shield plate to a drain of the ctrl switch.

* * * * *